United States Patent [19]
Uetani et al.

[11] Patent Number: 5,407,779
[45] Date of Patent: Apr. 18, 1995

[54] POSITIVE RESIST COMPOSITION

[75] Inventors: Yasunori Uetani, Toyonaka; Jun Tomioka, Takarazuka; Hirotoshi Nakanishi, Osaka, all of Japan

[73] Assignee: Sumitomo Chemical Company, Limited, Osaka, Japan

[21] Appl. No.: 71,409

[22] Filed: Jun. 4, 1993

[30] Foreign Application Priority Data

Jun. 4, 1992 [JP] Japan .................. 4-144204
Sep. 30, 1992 [JP] Japan .................. 4-261272
Dec. 25, 1992 [JP] Japan .................. 4-346400

[51] Int. Cl.⁶ .................. G03F 7/023; G03F 7/30
[52] U.S. Cl. .................. 430/192; 430/165; 430/191; 430/193; 534/557
[58] Field of Search .................. 430/165, 192, 193; 534/557

[56] References Cited

U.S. PATENT DOCUMENTS

5,153,096 10/1992 Uenishi et al. .................. 430/192
5,173,389 12/1992 Uenishi et al. .................. 430/192

FOREIGN PATENT DOCUMENTS

0395049 10/1990 European Pat. Off. .
0440238  8/1991 European Pat. Off. .
0455228 11/1991 European Pat. Off. .
62-10646  1/1987 Japan .
2-285351 11/1990 Japan .
2-296249 12/1990 Japan .
WO9001726 2/1990 WIPO .

OTHER PUBLICATIONS

SPIE vol. 1086 Advances in Resist Technology and Processing VI (1989) pp. 363–373.

*Primary Examiner*—Charles L. Bowers, Jr.
*Assistant Examiner*—John S. Chu
*Attorney, Agent, or Firm*—Birch, Stewart, Kolasch & Birch

[57] ABSTRACT

A positive resist composition comprising an alkali-soluble resin and a light-sensitive quinonediazide material containing a quinonediazidesulfonic acid ester of at least one phenol compound represented by the following general formulas:

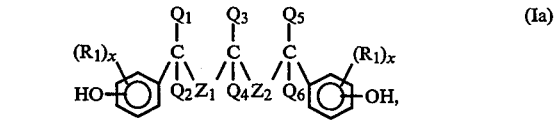

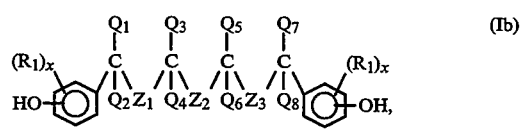

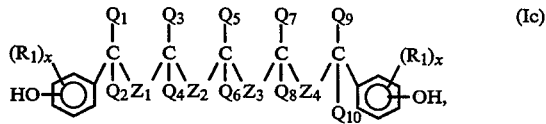

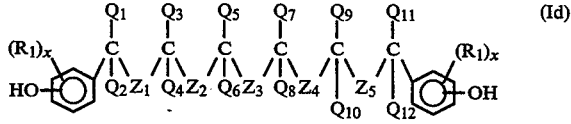

wherein $R_1$ represents hydrogen, halogen, or the like; $R_3$ represents alkyl or phenyl; x represents 1-3; $Q_1$ to $Q_{12}$ represent hydrogen, alkyl or phenyl; and $Z_1$ to $Z_5$ represent the groups of the following formulas:

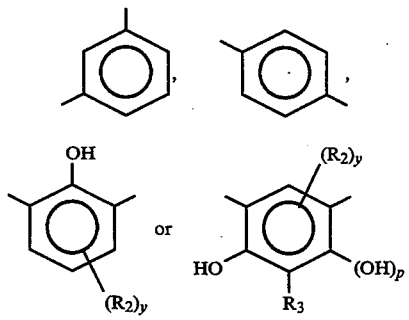

wherein $R_2$ is hydrogen, halogen or the like; $R_3$ is as defined above; y is 1-3; and p is 0 or 1. This positive resist composition is excellent in the balance between properties such as resolution, profile, depth of focus, etc.

8 Claims, No Drawings

POSITIVE RESIST COMPOSITION

BACKGROUND OF THE INVENTION

1. Field of the Invention

This invention relates to a positive resist composition which responds to radiations such as ultraviolet ray, far ultraviolet rays including excimer laser and the like, electron beam, ion beam, X ray and the like.

2. Related Art

Recently, with a rise in the integration level of integrated circuits, formation of patterns of sub-micron order is required, and it is desired to provide a positive resist composition which is excellent in various properties such as a profile, a depth of focus and resolution. In particular, for the production of 16–64M DRAMs, it is required to resolve a pattern having a line width of 0.5 μm or less with a good profile and a broad depth of focus.

In SPIE Vol. 1086, Advances in Resist Technology and Processing VI (1989)/Pages 363–373, there are mentioned positive resist compositions comprising cresol/formaldehyde novolak resin and a triester obtained through a condensation reaction of naphthoquinone-2-diazide-5-sulfonic acid with each of 2,3,4-trihydroxybenzophenone, 2,6-bis[(2-hydroxy-3,5-dimethylphenyl)methyl]-4-methylphenol and 2,6-bis[( 4-hydroxy-3,5-dimethylphenyl)-methyl]-4methylphenol.

In Japanese Patent Application KOKAI No. 2-285351, there is mentioned a positive photoresist composition comprising an alkali-soluble novolac resin and a photosensitive material obtainable by reacting a polyhydroxy compound having in one molecule at least one group represented by the following formula:

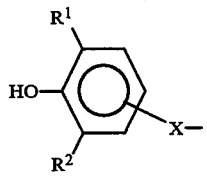

wherein $R^1$ and $R^2$ each represent hydrogen atom or a straight chain or branched chain alkyl or alkoxy group having 1–4 carbon atoms provided that $R^1$ and $R^2$ cannot simultaneously be hydrogen atom, and 1,2-naphthoquinone-5-(and/or -4-) sulfonyl chloride. In Japanese Patent Application KOKAI No. 2-296249, there is mentioned a positive resist composition comprising an alkali-soluble phenolic resin and a photosensitive material containing a quinonediazidesulfonate of a compound represented by the following formula:

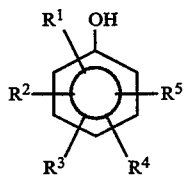

wherein $R^1$ to $R^5$ each represent hydrogen atom, halogen atom, alkyl, alkenyl or alkoxy group having 1–4 carbon atoms or hydroxyl group provided that at least one of $R^1$ to $R^5$ is a group of the following formula:

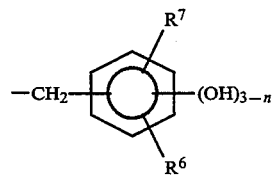

wherein $R^6$ and $R^7$ each represent halogen atom, alkyl group or alkenyl group and n represents 0, 1 or 2. Further, in Japanese Patent Application KOKAI No. 62-10646, there is mentioned a positive photoresist composition comprising an alkali-soluble phenolic resin and a photosensitive material containing a condensation product of a phenol compound represented by the following formula:

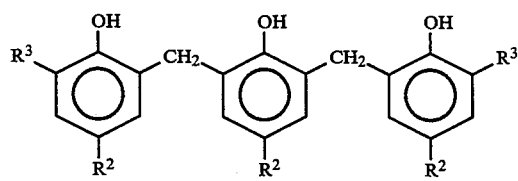

wherein $R^2$ to $R^3$ each represent hydrogen atom or lower alkyl group, with o-quinonediazidesulfonyl chloride. Further, in Japanese Patent Application KOKAI No. 2-296248, there is mentioned a positive resist composition comprising an alkali-soluble phenolic resin and, as a photosensitive material, a quinonediazidesulfonate represented by the following formula:

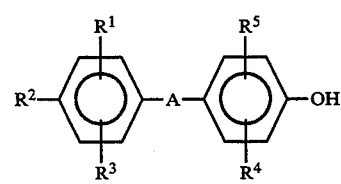

wherein $R^1$ to $R^5$ each represent hydrogen atom, halogen atom, $C_1$-$C_4$ alkyl, alkenyl or alkoxy, or hydroxyl group, provided that at least one of $R^1$ to $R^5$ is a group of the following formula:

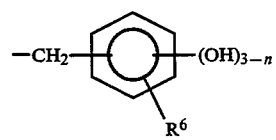

and A represents —S—, —O—, —C(O)—, —C(O)—O—, —S(O)—, —(O)S(O)— or —C($R^7$)($R^8$)— wherein $R^6$ represents halogen atom, alkyl group or alkenyl group, $R^7$ and $R^8$ each represent hydrogen atom, alkyl group, alkenyl group or phenyl group, and n represents 0, 1 or 2.

None of these composition, however, have been able to resolve a pattern having a line width of 0.5 μm or less with a broad depth of focus and with a good profile.

SUMMARY OF THE INVENTION

An object of this invention is to provide a positive resist composition which is excellent in the balance between properties such as resolution, profile, depth of focus, etc.

According to the present invention, there is provided a positive resist composition comprising an alkali-soluble resin and a light-sensitive quinonediazide material containing a quinonediazidesulfonic acid ester of at least one member selected from the phenol compounds represented by the following general formulas:

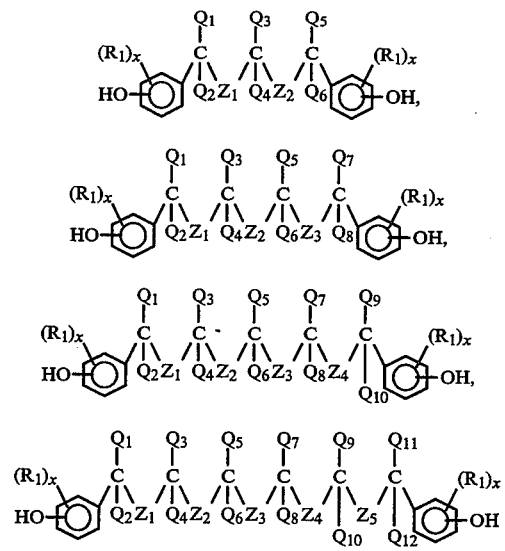

wherein $R_1$ represents hydrogen atom, halogen atom, —$OCOR_3$ or optionally substituted alkyl or alkoxy group, provided that $R_3$ represents optionally substituted alkyl or phenyl group; x represents an integer of 1-3; $Q_1$ to $Q_{12}$ independently of one another each represent hydrogen atom, alkyl group or phenyl group; $Z_1$ to $Z_5$ independently of one another each represent one of the following groups:

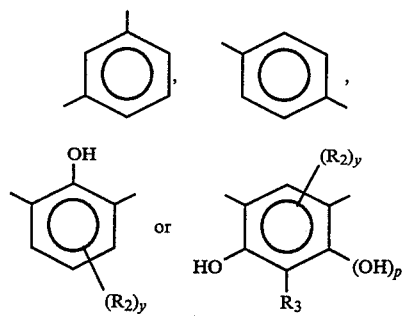

wherein $R_2$ represents hydrogen atom, halogen atom, —$OCOR_3$ or optionally substituted alkyl or alkoxy group, provided that $R_3$ is as defined above; y represents an integer of 1 or 2; and p represents 0 or 1.

DETAILED DESCRIPTION OF THE INVENTION

In the general formulas (Ia) to (Id) presented above, preferable examples of the optionally substituted alkyl group represented by $R_1$ to $R_3$ and the optionally substituted alkoxy group represented by $R_1$ to $R_2$ include those of straight chain and branched chain forms having 1-4 carbon atoms; and preferably examples of the alkyl group represented by $Q_1$ to $Q_{12}$ include straight chain and branched chain alkyl groups having 1-4 carbon atoms. Among these groups, methyl, ethyl, t-butyl and the like are particularly preferable as $R_1$ to $R_3$, and hydrogen atom, methyl group and the like are particularly preferable as $Q_1$ to $Q_{12}$. Preferable examples of the phenol compound represented by general formulas (Ia)–(Id) include the following:

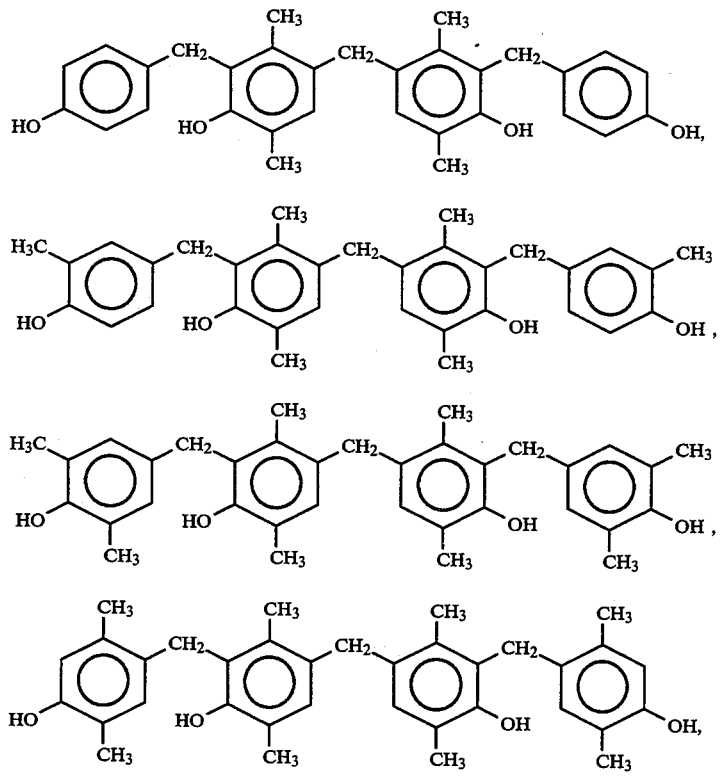

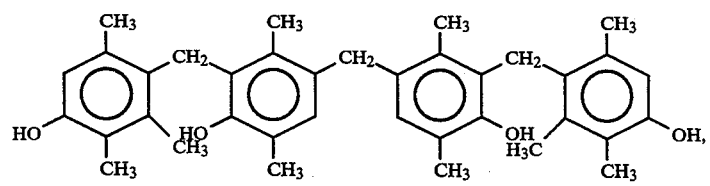
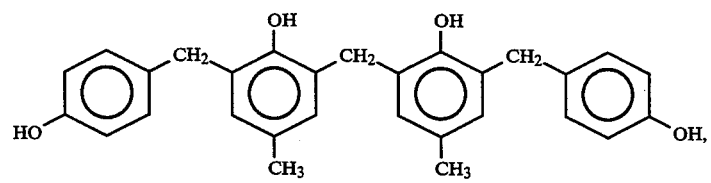
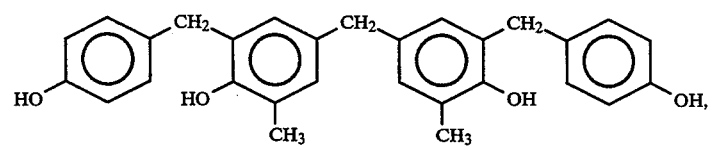
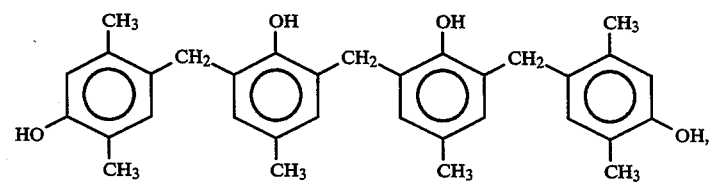
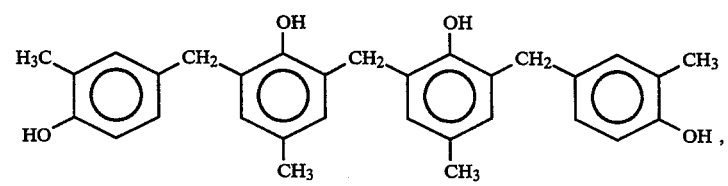
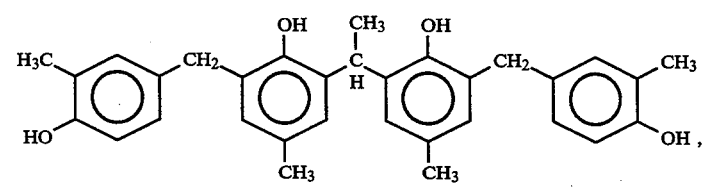
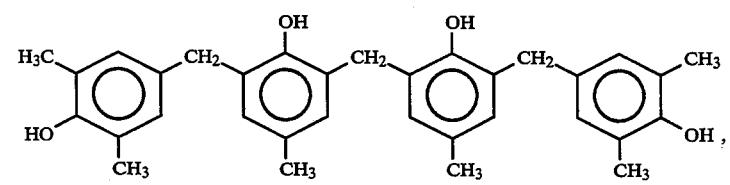
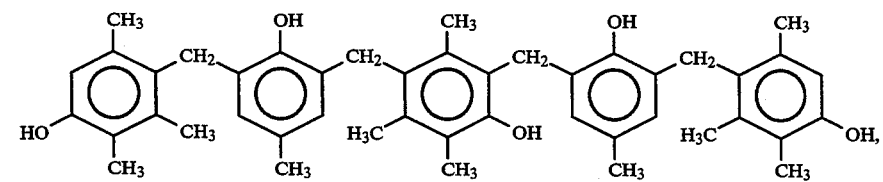
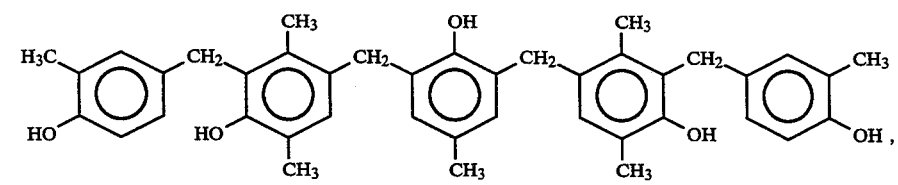

-continued
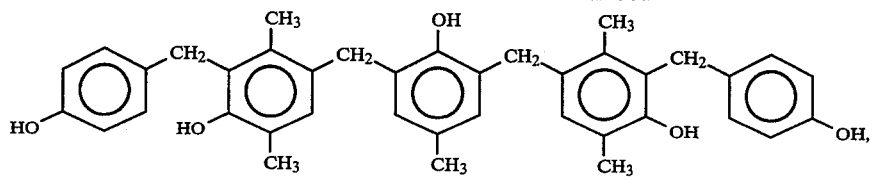
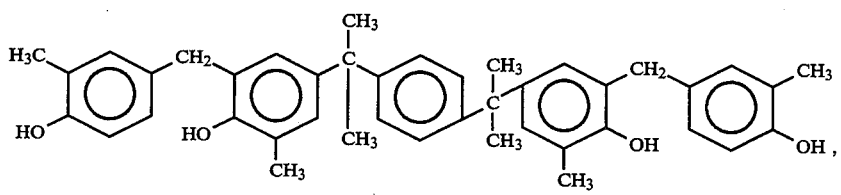
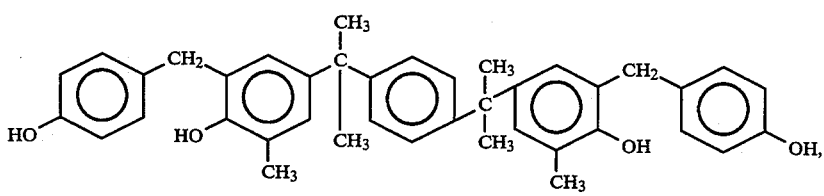
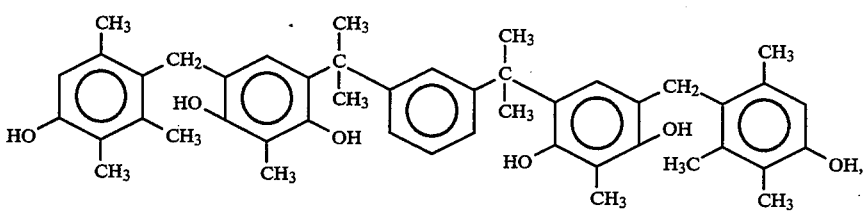
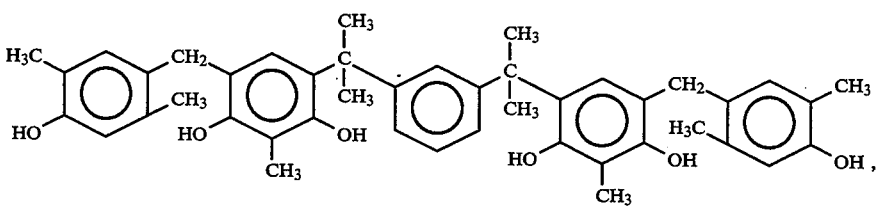
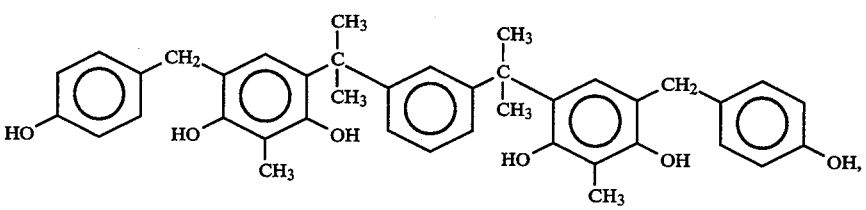
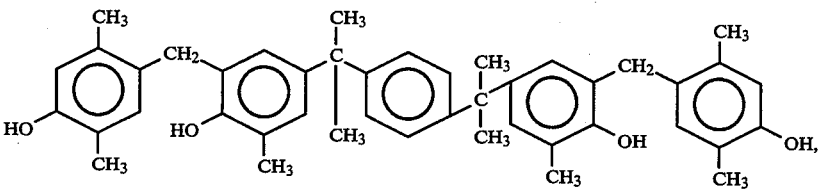
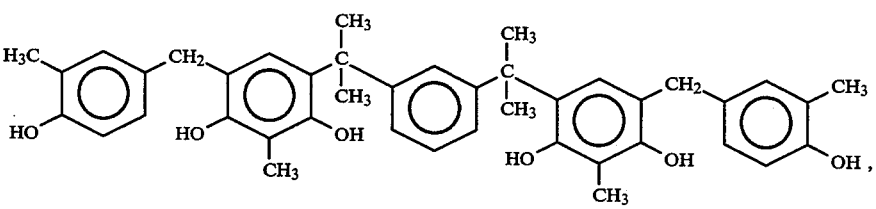

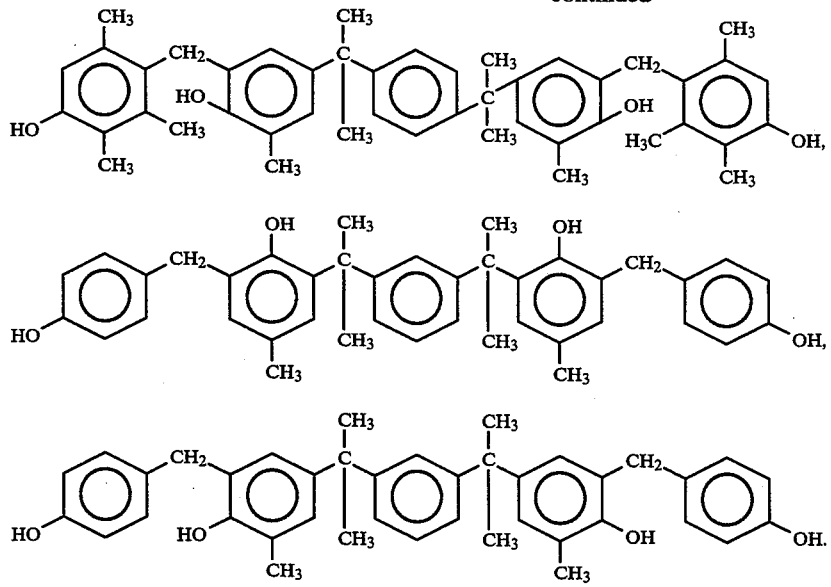

and the like.

The phenol compounds represented by the general formulas (Ia)–(Id) can be produced by, for example, reacting a compound represented by the following formula:

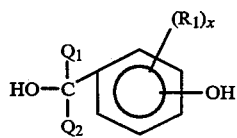

wherein $Q_1$, $Q_2$, $R_1$ and x are as defined above, with one member selected from the compounds represented by the following formulas:

H—$Z_1$—C($Q_3$) ($Q_4$)—$Z_2$—H

H—$Z_1$—C($Q_3$) ($Q_4$)—$Z_2$—C($Q_5$) ($Q_6$)—$Z_3$—H

H—$Z_1$—C($Q_3$) ($Q_4$)—$Z_2$—C($Q_5$) ($Q_6$)—$Z_3$—C($Q_7$) ($Q_8$)—$Z_4$—H

H—$Z_1$—C($Q_3$) ($Q_4$)—$Z_2$—C($Q_5$) ($Q_6$)—$Z_3$—C($Q_7$) ($Q_5$)—$Z_4$—C ($Q_9$) ($Q_{10}$)—$Z_5$—H wherein $Z_1$ to $Z_5$ and $Q_3$ to $Q_{10}$ are as defined above, in the presence of an acid catalyst such as p-toluenesulfonic acid, sulfuric acid or the like.

As for the ratio of the quinonediazidesulfonic acid diester of the phenol compound represented by general formulas (Ia)–(Id) to the total light-sensitive quinonediazide material, a greater ratio (diester/total light-sensitive material) is more desirable, as expressed by the pattern area measured by high speed liquid chromatography using 254 nm ultraviolet ray detector. Further preferably, the pattern area ratio is 0.5/1 or greater. When the ratio is in said range, a positive resist excellent in resolution, profile, γ value and the like can be obtained. If, for example, the summed content of tri- to hepta-esters formed between the phenol compound represented by formulas (Ia)–(Id) and quinonediazidesulfonic acid in the total light-sensitive quinonediazide material becomes higher, the result is not good because sensitivity decreases and residue of development (scum) increases. If the content of monoester between the phenol compound represented by formulas (Ia)–(Id) and quinonediazidesulfonic acid increases, the result is not good from the viewpoint of scum and resolution.

As the light-sensitive quinonediazide material, quinonediazidesulfonic acid esters of the phenol compounds represented by general formulas (Ia)–(Id) are preferable. When said esters are used, the result becomes better with regard to various properties as the proportion of the quinonediazidesulfonic acid diester, in which the hydroxyl groups attached to the two terminal benzene rings in formulas (Ia)–(Id) are both esterified increases.

The quinonediazidesulfonic acid esters of the phenol compounds represented by general formulas (Ia)–(Id) can be produced by, for example, reacting a phenol compound represented by one of formulas (Ia)–(Id) with 1,2-naphthoquinonediazidesulfonic acid halide or 1,2-benzoquinonediazidesulfonic acid halide in the presence of a weak alkali. By appropriately selecting the reaction conditions such as molar ratio of phenol compound to halide and the like in this reaction, a quinonediazidesulfonic acid diester of the phenol compound represented by formulas (Ia)–(Id) can be obtained in a high selectivity.

The quantity of the light-sensitive quinonediazide material is usually 5–50% by weight and preferably 10–40% by weight based on the total solid component in the positive resist composition.

The alkali-soluble resin can be obtainable through an addition condensation reaction of a phenol compound with an aldehyde compound. Examples of said phenol compound include phenol, o-, m- and p-cresols, 2,5-xylenol, 3,5-xylenol, 3,4-xylenol, 2,3,5-trimethylphenol, 4-t-butylphenol, 2-t-butylphenol, 3-t-butylphenol, 3-ethylphenol, 2-ethylphenol, 4-ethylphenol, 3-methyl-6-t-butylphenol, 4-methyl-2-t-butylphenol, 2-naphthol, 1,3-dihydroxynaphthalene, 1,7-dihydroxynaphthalene, 1,5-dihydroxynaphthalene, one member or mixture of two or more members selected from the phenol compounds represented by general formula (III):

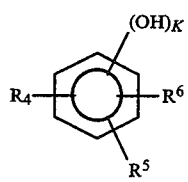

wherein $R_4$ to $R_6$ independently of one another each represent hydrogen atom or alkyl or alkoxy group having 1-4 carbon atoms and k represents 1 or 2, and one member or mixture of two or more members selected from the compounds represented by general formula (IV):

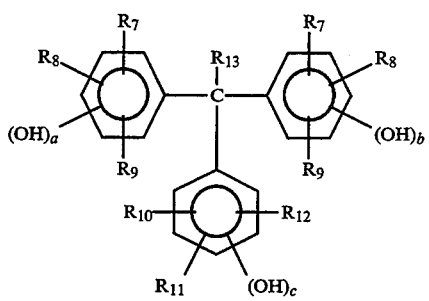

wherein $R_7$ to $R_{12}$ independently of one another each represent hydrogen atom or alkyl or alkoxy group having 1-4 carbon atoms, $R_{13}$ represents hydrogen atom, alkyl group having 1-4 carbon atoms or aryl group, and a, b and c each represent 0, 1 or 2, provided that $a+b+c>2$, and the like. These phenol compounds are used either singly or in the form of a mixture of two or more members.

Examples of the aldehyde compound include formaldehyde, paraformaldehyde, acetaldehyde, propyl aidehyde, benzaldehyde, phenyl aidehyde, α and β-phenylpropyl aldehydes, o-, m- and p-hydroxybenzaldehydes, glutaraldehyde, glyoxal, o- and p-methylbenzaldehydes, and the like.

The addition-condensation reaction of a phenol compound with an aldehyde compound is carried out in the usual manner in the presence of an acid catalyst. As for the reaction conditions, the temperature is usually 60°–250° C. and the reaction time is usually 2–30 hours in a molar ratio of 0.001/1 to 1/1. Examples of the acid catalyst include, for example, organic acids such as oxalic acid, formic acid, trichloroacetic acid, p-toluenesulfonic acid and the like, inorganic acids such as hydrochloric acid, sulfuric acid, perchloric acid, phosphoric acid and the like, and divalent metal salts such as zinc acetate, magnesium acetate and the like. The addition condensation reaction is carried out either in a bulk phase or in an appropriate solvent (e.g., methyl isobutyl ketone, toluene, etc.) and the like. The alkali-soluble resin obtained by the addition-condensation reaction preferably has a polystyrene-converted weight average molecular weight of 2,000–50,000.

In view of the heat resistance and scum, the alkali-soluble resin obtained by the addition-condensation reaction is treated by, for example, fractionation, so that an area in a GPC pattern (using a detector of 254 nm; hereinafter the same) of a range in which a polystyrene-converted molecular weight of 1,000 or less does not exceed preferably 25%, more preferably 20% and particularly preferably 15% of the whole pattern area excluding unreacted phenol compound.

The fractionation is carried out by a method which comprises dissolving the alkali-soluble resin obtained by the addition condensation reaction in a good solvent such as alcohols (methanol, ethanol and the like), ketones (acetone, methyl ethyl ketone, methyl isobutyl ketone and the like), ethylene glycol or its ethers, etheresters (ethyl cellosolve acetate and the like), tetrahydrofuran and the like, and pouring a resulting solution in water to precipitate the resin, or by pouring the solution in a solvent such as pentane, hexane, heptane, cyclohexane or the like to separat it. After the fractionation, the alkali-soluble resin preferably has a weight average molecular weight of 3,000–20,000.

The quantity of the alkali-soluble resin is 50–95%, preferably 60–90%, by weight based on the total solid component in the positive resist composition. If necessary, the positive resist composition of this invention, may contain an alkali-soluble compound having a molecular weight lower than 900 as a sensitivity regulator. Examples of the alkali-soluble compound having a molecular weight lower than 900 include the compounds represented by the above-mentioned general formula (IV), the compounds mentioned in Japanese Patent Application KOKAI No. 4-50851 as general formula (I), the compounds mentioned in Japanese Patent Application KOKAI No. 3-179353 as general formula (I), and the like. Preferably, the alkali-soluble compound having a molecular weight lower than 900 is used in an amount of 3–40% by weight based on the total solid component in the positive resist composition.

If necessary, the positive resist composition, may contain various additives such as sensitizer, other resin, surfactant, stabilizer, dye for making the formed image more visible, and the like.

A solvent in which the components are dissolved is preferably one that evaporates at an appropriate drying rate to give a uniform and smooth coating film. Examples of such solvent include glycoletheresters such as ethylcellosolve acetate, propyleneglycol monomethylether acetate and the like; the solvents mentioned in Japanese Patent Application KOKAI No. 2-220056, esters such as ethyl pyruvate, namyl acetate, ethyl lactate and the like; and ketones such as 2-heptanone, γ-butyrolactone and the like. These solvents may be used either singly or in the form of a mixture of two or more members.

An amount of the solvent is not particularly critical, so far as the-composition can form a uniform film on a wafer without pin-holes and coating irregularity. Usually, the amount of the solvent is adjusted so that the content of solid component, including light-sensitive quinonediazide material, alkali-soluble resin and various additives, is from 3 to 50% by weight.

The positive resist composition of this invention is excellent in the balance between the properties required of a resist, such as resolution, profile, focal depth, etc.

PREFERRED EMBODIMENTS OF THE INVENTION

The present invention will be explained by following examples which do not intend to limit the scope of the present invention. In examples, "parts" are by weight.

Synthesis Example 1-(1)

Into a mixture of 733.2 g of 2,5-xylenol, 60.0 g of sodium hydroxide and 540 g of water was dropwise added 162.2 g of 37% aqueous solution of formaldehyde at 70°–75° C. in 3 hours. After the dropping, the resulting mixture was stirred at the same temperature as above for 4 hours. After cooling the mixture to 55° C., 172 g of 36% hydrochloric acid was added and stirred for 10 minutes, and then 1,500 g of methyl isobutyl ketone was added to dissolve the reaction mixture completely. The resulting solution was washed with 150 g of deionized water at the same temperature as above, and then separated into two liquid phases. The oily phase thus obtained was concentrated, and mixed with 500 g of toluene and stirred overnight at room temperature. The deposited crystalline product was collected by filtration, and the cake thus obtained was washed with 800 g of toluene to obtain 425.1 g of wet cake. Then, 425 g of ethyl acetate and 300 g of toluene were added to the wet cake and stirred at 75°–80° C. for 2 hours. After concentrating the solvent, 500 g of toluene was added and stirred at 75°–80° C. for one hour. Then, the mixture was cooled to room temperature and the resulting deposited crystalline product was filtered. The cake thus obtained was stirred and washed with 800 g of toluene and then filtered and dried to obtain 193.5 g of a compound represented by the following formula:

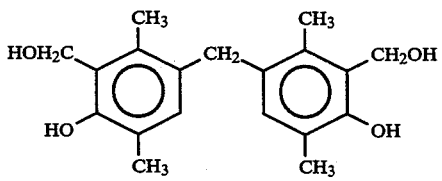

Synthesis Example 1-(2)

While keeping a mixture of 188 g of phenol, 46 g of water and 0.9 g of 96% sulfuric acid at 30°–35° C., 31.6 g of the compound obtained in Synthesis Example 1-(1) was charged thereinto in ten portions at intervals of 30 minutes. After completing the charge, the resulting mixture was stirred at the same temperature as above for 2 hours. Then, a mixture of 200 ml of toluene, 200 ml of ethyl acetate and 300 ml of water was added for the sake of washing, and then the whole mixture was separated into two liquid phases. The oily layer thus obtained was concentrated, and the concentrate was added to a mixture of 9.3 g of ethyl acetate and 186 g of toluene and stirred overnight at room temperature. The deposited crystalline product was collected by filtration, and the cake thus obtained was stirred and washed with 60 ml of toluene. After filtration, the cake thus obtained was dissolved in 32.7 g of acetone at 50°–55° C. After adding 68 g of toluene, the acetone was evaporated off, and the residue was filtered. The cake thus obtained was stirred and washed with 50 ml of toluene. After filtration, the cake thus obtained was dissolved in acetone, toluene was added, the acetone was evaporated, and the resulting crystalline product was filtered. The cake thus obtained was stirred with toluene and filtered, and then the cake thus obtained was dried to obtain 18.5 g of a compound represented by the following formula:

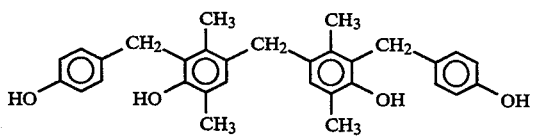

Synthesis Example 2

To a mixture of 14 g of the compound obtained in Synthesis Example 1-(2), 16.08 g of 1,2-naphthoquinonediazide-5-sulfonyl chloride and 150.4 g of dioxane was dropwise added 7.27 g of triethylamine at 20°–30° C. in 30 minutes. After the dropping, the resulting mixture was stirred at 30° C. for 6 hours. Then, 2.44 g of acetic acid was added, and the resulting mixture was stirred at the same temperature as above for one hour. Then, the reaction mixture was filtered, and the residue of filtration thus obtained was washed with 16.1 g of dioxane. The filtrate and the washings were poured into a mixed solution of 5 g of acetic acid and 500 g of deionized water, and stirred for one hour. The deposited crystalline product was collected by filtration, and the cake thus obtained was stirred and washed with 500 g of deionized water. After filtration, the cake was dried at 40° C. Thus, 28 g of light-sensitive material A was obtained.

Synthesis Example 3

A mixture of 50.46 g of 2,3,5-trimethylphenol, 50.46 g of 2,6-bishydroxymethyl-p-cresol, 132.46 g of methanol and 3.06 g of 96% sulfuricacid was allowed to react at 40° C. for 24 hours. Then, 1 kg of ethyl acetate and 2 kg of deionized water were added to the reaction mixture and stirred for the sake of washing. After separating the mixture into two liquid phases, the organic layer was further washed with 2 kg of deionized water. The organic layer was mixed with 300 g of toluene and allowed to stand at room temperature for about 36 hours. The resulting crystalline product was collected by filtration, washed with n-hexane and recrystallized from ethyl acetate/toluene (1:9) to obtain a compound represented by the following formula:

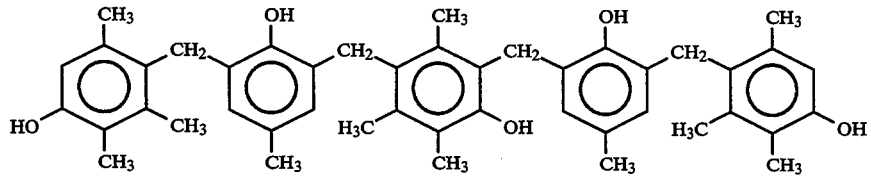

Synthesis Example 4

To a mixture of 13.44 g of the compound obtained in Synthesis Example 3, 10.75 g of naphthoquinone-(1,2)-diazide-(2)-5-sulfonyl chloride (molar ratio of reactants=1:2) and 168 g of dioxane was dropwise added 4.45 g of triethylamine at 20°–25° C. over a period of 30 minutes. After the dropping, the resulting mixture was stirred at the same temperature as above for 4 hours. The reaction mixture was poured into deionized water, and the resulting crystalline product was collected by filtration, washed with deionized water and dried to obtain light-sensitive material F.

Synthesis Example 5

To a mixture of 12.3 g of a compound represented by the following formula:

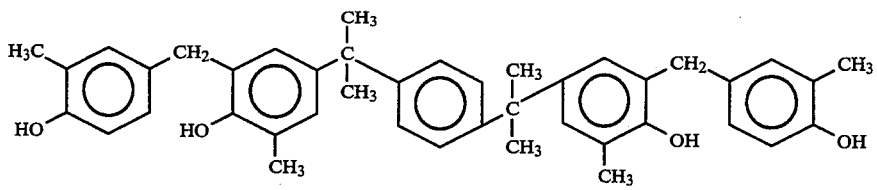

10.75 g of naphthoquinone(1,2)-diazide-(2)-5-sulfonyl chloride (molar ratio of reactants=1:2) and 168 g of dioxane was dropwise added 4.45 g of triethylamine at 25°–25° C. over a period of 30 minutes. After the dropping, the resulting mixture was stirred for an additional 4 hours at the same temperature as above. The reaction mixture was poured into deionized water, and the resulting crystalline precipitate was collected by filtration, washed with deionized water and dried to obtain light-sensitive material J.

Synthesis Example 6

Synthesis Example 5 was repeated, except that the compound represented by the formula shown in Synthesis Example 5 was replaced with a compound represented by the following formula:

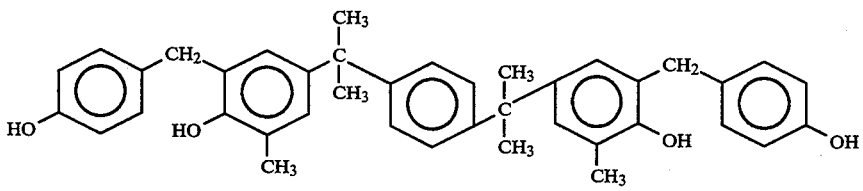

Thus, light-sensitive material K was obtained.

Examples 1 to 9 and Comparative Examples 1 and 2

According to the formulation shown in Table 1, an alkali-soluble resin (abbreviated to "resin" in Table 1), a light-sensitive quinonediazide material (abbreviated to "light-sensitive material" in Table 1) and additives were mixed with 50 parts of 2-heptanone. The resulting mixed solution was filtered by means of a Teflon filter having a pore size of 0.2 μm to prepare a resist solution.

Using a spinner, the resist solution was coated on a silicon wafer which had been rinsed in a usual manner to form a resist of 1.1 μm in thickness. Subsequently, the silicon wafer was baked on a hot plate at 90° C. for one minute, and was exposed to light having a wavelength of 365 nm (i line) while varying the exposure time stepwise by means of a reduction projection exposing apparatus (manufactured by Nicon Co., NSR1755i7A with NA=0.5). Then, the wafer was baked on a hot plate at 110° C. for one minute, and was developed with SOPD (developing solution; manufactured by Sumitomo Chemical Co. Ltd.) for one minute to obtain a positive pattern.

Resolution was evaluated by observing, with a scanning electron microscope, a width of a line-and-space pattern which was separated without film thickness decrease at an exposure amount (effective sensitivity) at which a 0.50 μm line-and-space pattern was 1:1.

Profile was evaluated by observing the cross-sectional shape of 0.45 μm line-and-space pattern at the effective sensitivity with a scanning electron microscope.

A depth of focus determined by measuring, with a scanning electron microscope, a degree of focus shifting at which the 0.45 μm line-and-space pattern could be resolved at an effective sensitivity without film thickness decrease.

Regarding the scum, the presence of residue between the lines of a 0.45 μm line-and-space was investigated at the best focus at the effective sensitivity.

The results obtained are shown in Table 1.

TABLE 1

| | Composition of resist | | | Properties of resist | | | | |
|---|---|---|---|---|---|---|---|---|
| Example No. | Resin (parts) | Additive (parts) | light-sensitive material (parts) | Effective sensitivity (msec) | Resolution (uM) | Profile | Depth of focus (μM) | Scum |
| Example 1 | a 15 | 4.5 | A 5 | 520 | 0.35 | ⊓ | 1.6 | Unnoticeable |
| Example 2 | a 15 | 4.5 | B 5 | 540 | 0.35 | ⊓ | 1.6 | Unnoticeable |
| Example 3 | a 15 | 4.5 | C 5 | 500 | 0.35 | ⊓ | 1.4 | Unnoticeable |

TABLE 1-continued

| | Composition of resist | | | Properties of resist | | | | |
|---|---|---|---|---|---|---|---|---|
| Example No. | Resin (parts) | Additive (parts) | light-sensitive material (parts) | Effective sensitivity (msec) | Resolution (uM) | Profile | Depth of focus ($\mu M$) | Scum |
| Example 4 | b 15 | 4.5 | D 5 | 420 | 0.375 | ⊓ | 1.2 | Unnoticeable |
| Example 5 | a 15 | 4.5 | E 5 | 400 | 0.375 | ⊓ | 1.0 | Unnoticeable |
| Example 6 | a 15 | 4.5 | F 5 | 540 | 0.35 | ⊓ | 1.4 | Unnoticeable |
| Example 7 | c 15 | 4.5 | G 5 | 500 | 0.35 | ⊓ | 1.4 | Unnoticeable |
| Comparative Example 1 | a 15 | 4.5 | H 5 | 650 | 0.425 | ◁▷ (trapezoid) | 0.8 | Noticeable |
| Comparative Example 2 | a 15 | 4.5 | I 5 | 600 | 0.45 | ◁▷ (trapezoid) | 0.6 | Noticeable |
| Example 8 | a 15 | 4.5 | J 7 | 600 | 0.375 | ⊓ | 1.2 | Unnoticeable |
| Example 9 | a 15 | 4.5 | K 7 | 550 | 0.375 | ⊓ | 1.2 | Unnoticeable |

In Table 1 presented above, the light-sensitive materials A to I were those obtained by reacting one of the following phenol compounds A' to I' with naphthoquinone(1,2)-diazide-(2)-5-sulfonic acid chloride in the same manner as in Synthesis Example 2, provided that in the reaction the molar ratio of naphthoquinone(1,2)-diazide-(2)-5-sulfonic acid to the phenol compound was 2.0 throughout all the cases.

A':

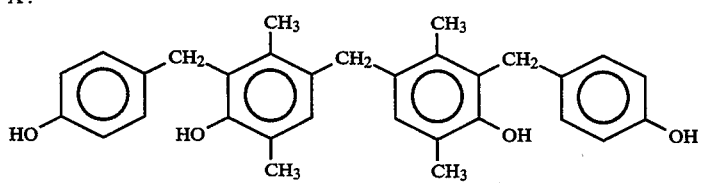

B':

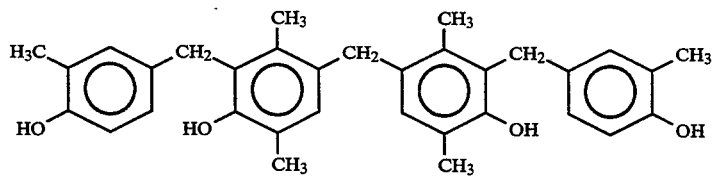

C':

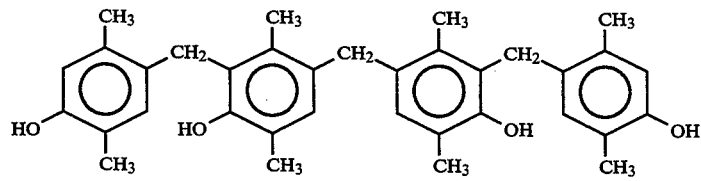

D':

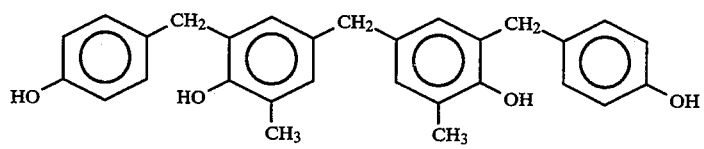

E':

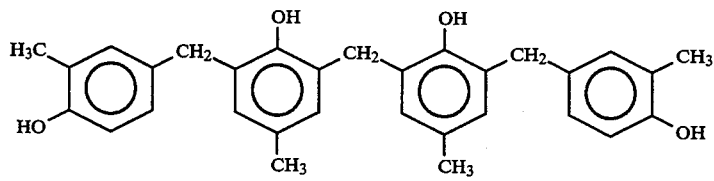

F':

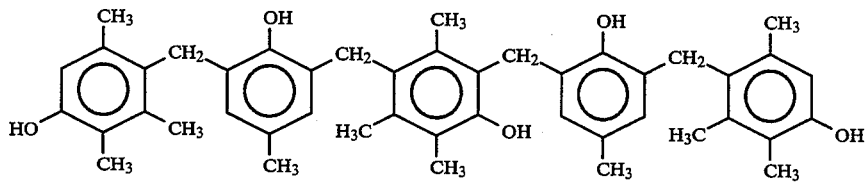

G':

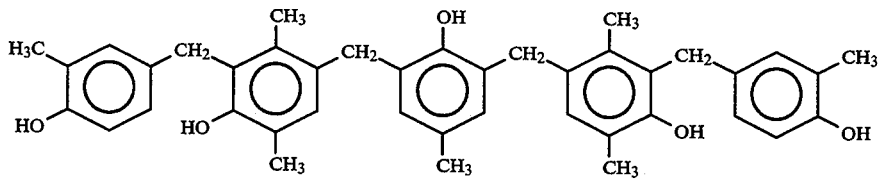

H':

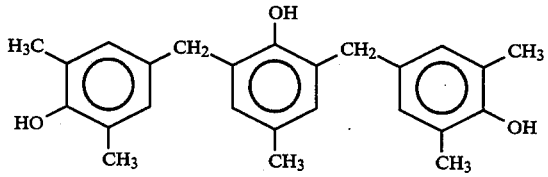

I':

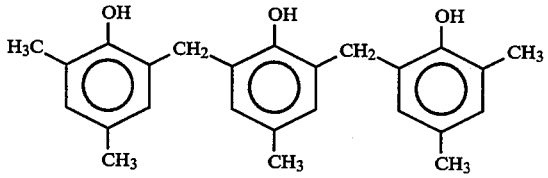

Resin a: An alkali-soluble novolak resin was obtained through an addition-condensation reaction of phenol compounds with formaldehyde (m-cresol/p-cresol=70/30, a molar ratio cresol/formaldehyde=1/0.8) in the presence of an oxalic acid catalyst under reflux. In the GPC pattern of this resin, the ratio of the pattern area of a component having a molecular weight of 6,000 or less was 34% and the ratio of the pattern area of a component having a molecular weight of 1,000 or less was 15%, both based on the total pattern area from which the pattern area of unreacted phenol compound was excepted. Said resin had a weight average molecular weight of 8,000 (All the molecular weights were polystyrene-converted molecular weights).

Resin b: A novolak resin obtained by the same procedure as above, except that the molar ratio m-cresol/p-cresol was altered to 60/40.

Resin c: A novolak resin obtained by the same procedure as above, except that the molar ratio m-cresol/p-cresol was altered to 50/50.

Additive: A compound represented by the following formula:

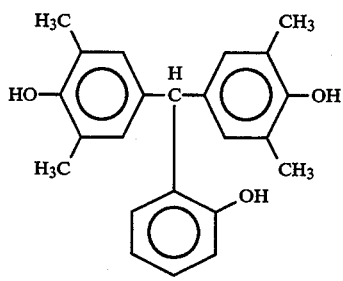

Table 2 illustrates results of measurements by high speed liquid chromatography, wherein the term "diester ratio" signifies the ratio of pattern area of the quinonediazidesulfonic acid diester to the pattern area of total quinonediazidesulfonic acid esters (total light-sensitive material).

TABLE 2

| Example No. | Diester ratio |
|---|---|
| Example 1 | 0.70/1 |
| Example 2 | 0.68/1 |
| Example 3 | 0.54/1 |
| Example 4 | 0.81/1 |
| Example 5 | 0.51/1 |
| Example 6 | 0.75/1 |
| Example 7 | 0.62/1 |
| Comparative Example 1 | 0.43/1 |
| Comparative Example 2 | 0.62/1 |
| Example 8 | 0.70/1 |
| Example 9 | 0.85/1 |

What is claimed is:

1. A positive resist composition comprising in admixture an alkali-soluble resin and a light-sensitive quinonediazide material containing a quinonediazidesulfonic acid diester of at least one member selected from the phenol compounds represented by the following general formulas:

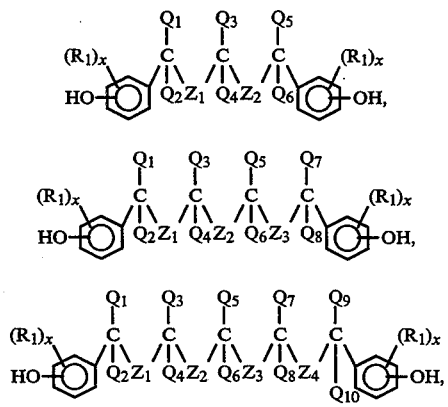

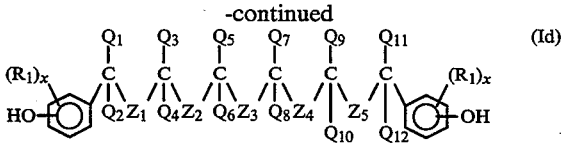

wherein $R_1$ represents hydrogen atom, halogen atom, —$OCOR_3$ or optionally substituted alkyt or alkoxy group; $R_3$ represents optionally substituted alkyl or phenyl group; x represents an integer of 1–3; $Q_1$ to $Q_{12}$ independently of one another each represent hydrogen atom, alkyl group or phenyl group; and $Z_1$ to $Z_5$ independently of one another each represent the groups of the following formulas:

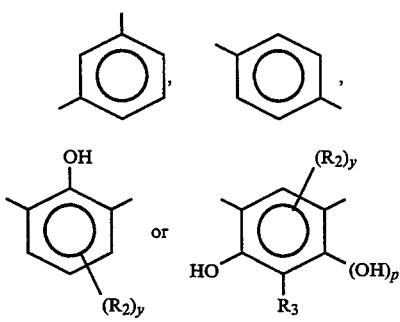

wherein $R_2$ represents hydrogen atom, halogen atom, —$OCOR_3$ or optionally substituted alkyl or alkoxy group; $R_3$ is as defined above; y represents an integer of 1 or 2; and p represents 0 or 1 wherein a pattern area ratio of the guinonediazidesulfonic acid diester is 0.5/1 or greater to the whole pattern area of the total liqht-sensitive quinonediazide material, as expressed by the pattern area measured by high speed liquid chromatography using a 254 nm ultraviolet ray detector.

2. A positive resist composition according to claim 1, wherein in the general formulas (Ia) to (Id), $R_1$ is a halogen atom, —$OCOR3$ or an optionally substituted alkyl or a! koxy group, and x is 2 or 3, provided that $R_3$ is defined in claim 1.

3. A positive resist composition according to claim 1, wherein the quinonediazidesulfonic acid ester of the phenol compound is one prepared by the reaction of a phenol compound represented by the formula:

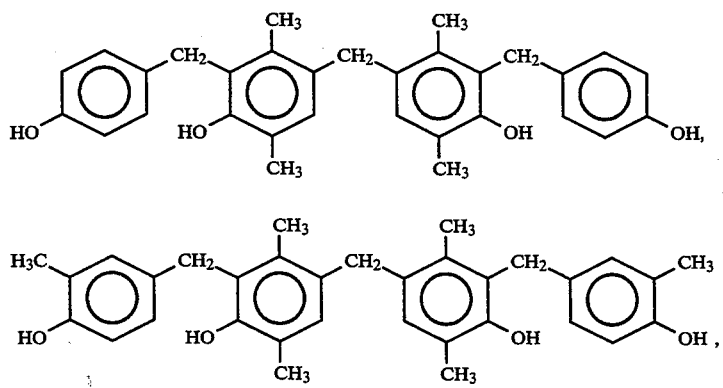

-continued
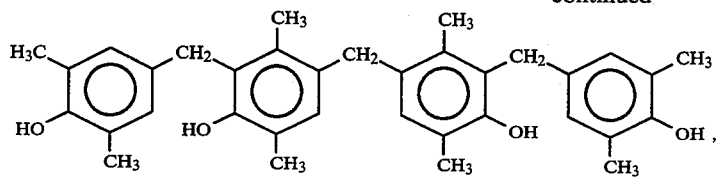
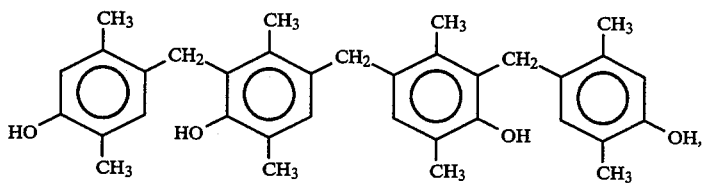
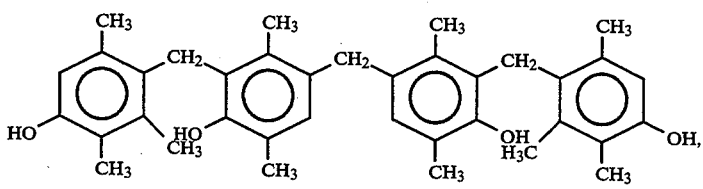
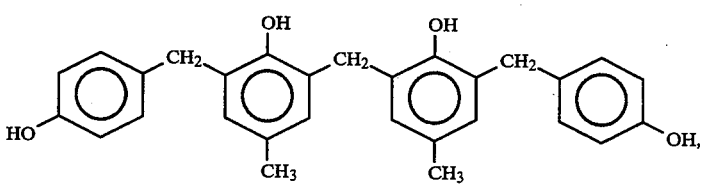
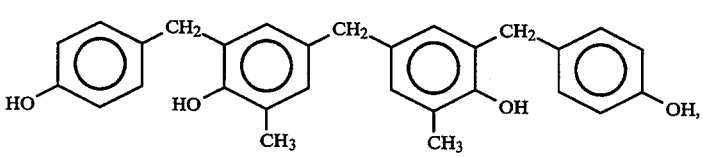
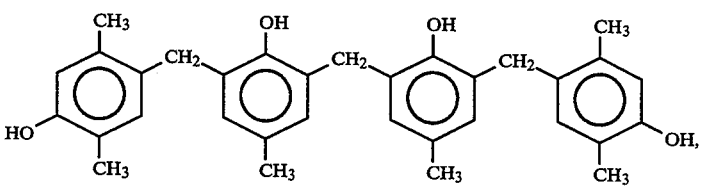
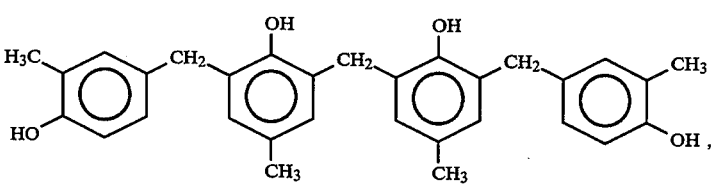
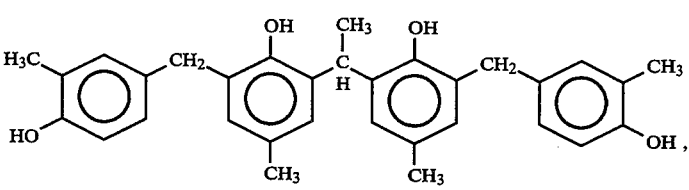
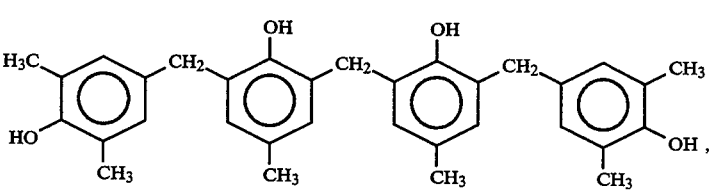

-continued
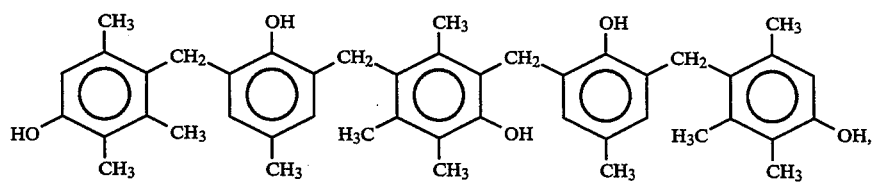
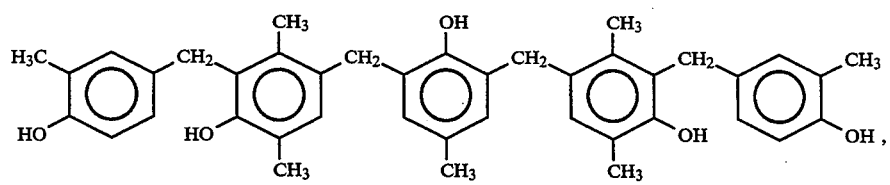
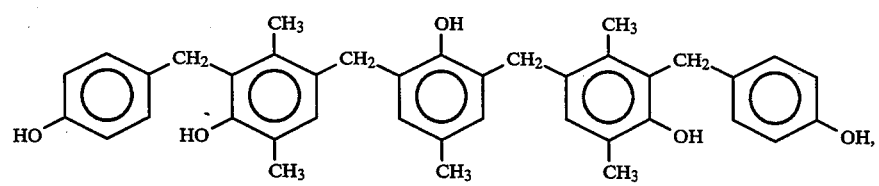
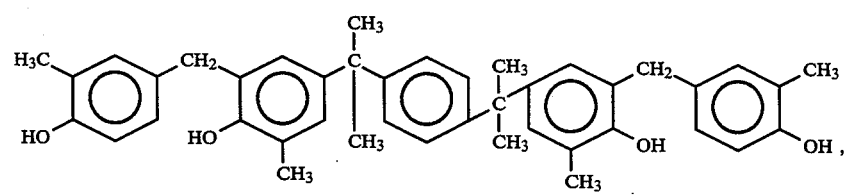
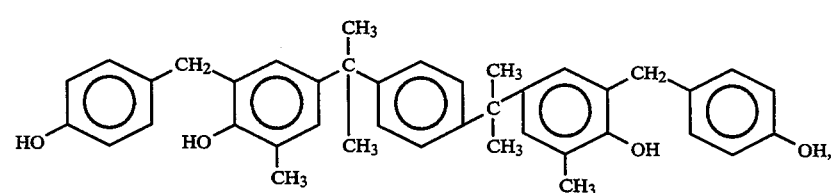
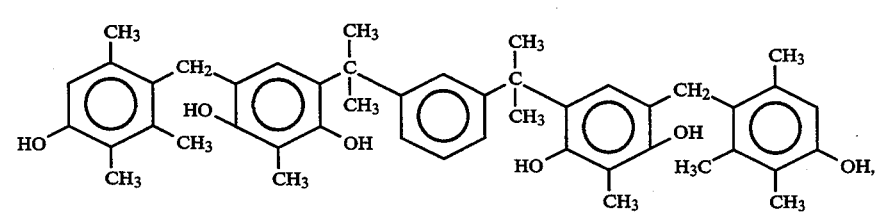
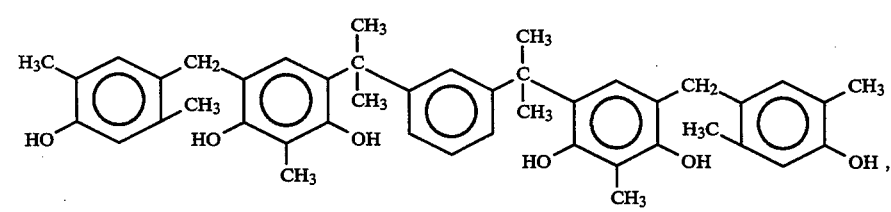
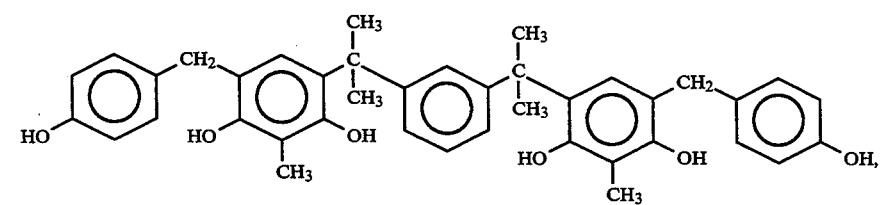

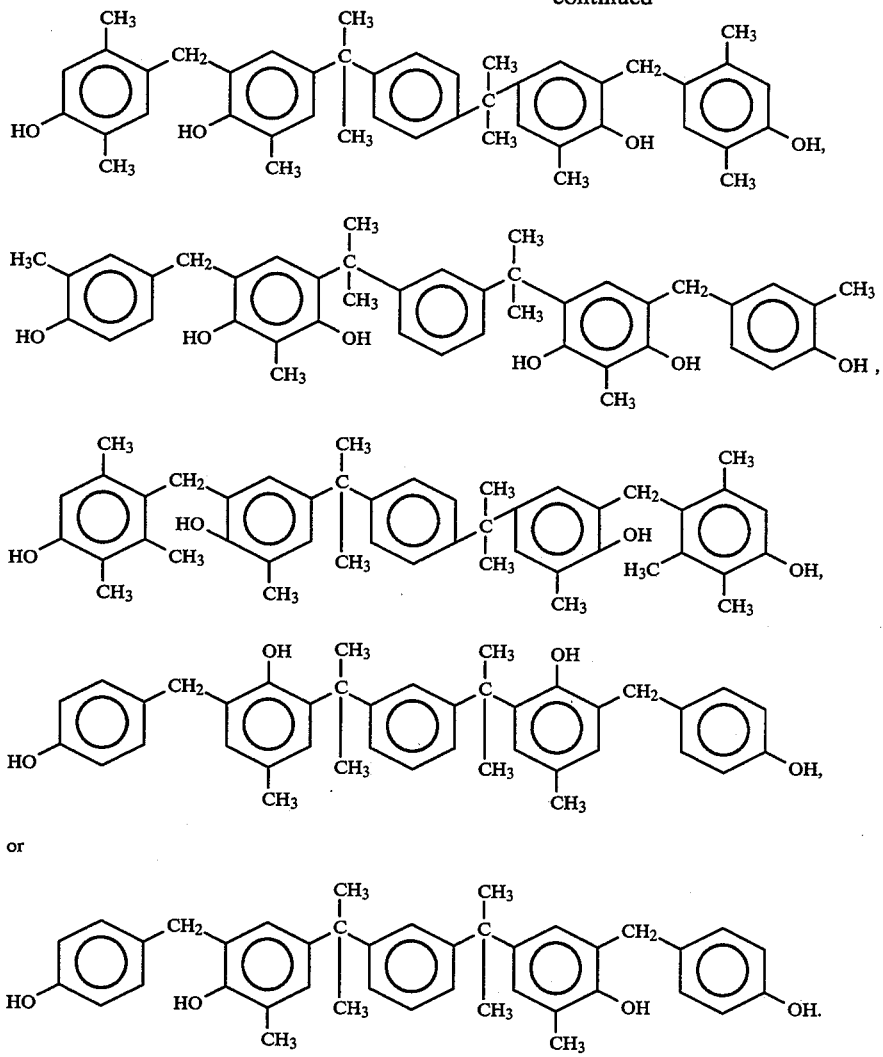

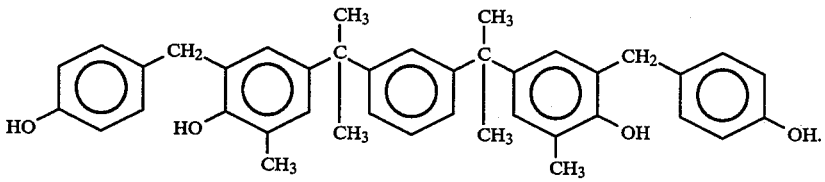

or with 1,2-naphthoquinonediazidesulfonyl halide or 1,2-benzoquinonediazidesulfonyl halide in the presence of a weak alkali.

4. A positive resist composition according to claim 1, wherein the alkali-soluble resin is one prepared by addition-condensation reaction of at least one member selected from the group consisting of phenol, o-, m- and p-cresols, 2,5-xylenol, 3,5-xylenol, 3,4-xylenol, 2,3,5-trimethylphenol, 4-t-butylphenol, 2-t-butylphenol, 3-t-butylphenol, 3-ethylphenol, 2-ethylphenol, 4-ethylphenol, 3-methyl-6-t-butylphenol, 4-methyl-2-t-butylphenol, 2-naphthol, 1,3-dihydroxynaphthalene, 1,7-dihydroxynaphthalene and 1,5-dihydroxynaphthalene, with an aldehyde compound selected from the group consisting of formaldehyde, paraformaldehyde, acetaldehyde, propyl aidehyde, benzaldehyde, phenyl aidehyde, α- and β-phenylpropyl aldehydes, o-, m- and p-hydroxybenzaldehydes, glutaraldehyde, glyoxal and o- and p-methylbenzaldehydes.

5. A positive resist composition according to claim 4, wherein the addition-condensation reaction is carried out in the presence of an acid catalyst at 60° to 250° C. for 2 to 30 hours.

6. A positive resist composition according to claim 1, wherein the alkali-soluble resin has a polystyrene converted weight average molecular weight of 2,000–50,000.

7. A positive resist composition according to claim 1, wherein the alkali-soluble resin is used in an amount of 50–95% by weight based on the total solid component in the positive resist composition.

8. A positive resist composition according to claim 1, wherein the light-sensitive quinonediazide material is used in an amount of 5–50% by weight based on the total solid component in the positive resist composition.

* * * * *